United States Patent
Parks

(10) Patent No.: US 10,797,101 B2
(45) Date of Patent: Oct. 6, 2020

(54) TIME DELAY INTEGRATION IMAGE SENSORS WITH NON-DESTRUCTIVE READOUT CAPABILITIES

(71) Applicant: SEMICONDUCTOR COMPONENTS INDUSTRIES, LLC, Phoenix, AZ (US)

(72) Inventor: Christopher Parks, Pittsford, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 79 days.

(21) Appl. No.: 16/160,423

(22) Filed: Oct. 15, 2018

(65) Prior Publication Data
US 2020/0119083 A1   Apr. 16, 2020

(51) Int. Cl.
| | |
|---|---|
| H04N 5/372 | (2011.01) |
| H01L 27/148 | (2006.01) |
| H04N 5/378 | (2011.01) |
| H01L 27/146 | (2006.01) |

(52) U.S. Cl.
CPC .. *H01L 27/14856* (2013.01); *H01L 27/14634* (2013.01); *H01L 27/14812* (2013.01); *H04N 5/372* (2013.01); *H04N 5/378* (2013.01)

(58) Field of Classification Search
CPC .................................................. H04N 5/372
USPC ....................................................... 348/294
See application file for complete search history.

(56) References Cited

U.S. PATENT DOCUMENTS

| | | | |
|---|---|---|---|
| 7,796,174 B1* | 9/2010 | Harwit | H01L 27/14806 250/208.1 |
| 2011/0156197 A1 | 6/2011 | Tivarus et al. | |
| 2012/0199902 A1* | 8/2012 | Kao | H01L 29/407 257/331 |
| 2013/0076949 A1 | 3/2013 | Compton et al. | |

OTHER PUBLICATIONS

Takahashi et al., "A Stacked CMOS Image Sensor With Array-Parallel ADC Architecture"; IEEE Journal of Solid-State Circuits, vol. 53, No. 4. Apr. 2018.
Kondo et al., "A 3D stacked CMOS image sensor with 16Mpixel global-shutter mode using 4 million interconnections"; Image Sensor Workshop. 2015.
Boulenc et al., "High Speed Backside Illuminated TDI CCD-in-CMOS Sensor"; Image Sensor Workshop. 2017.
Krymski, "A High Speed 1 MPix Sensor with Floating Storage Gate Pixel"; Image Sensor Workshop. 2015.
Lan et al., "A High-Dynamic-Range Optical Remote Sensing Imaging Method for Digital TDI CMOS"; Applied Sciences. Oct. 20, 2017.

* cited by examiner

Primary Examiner — Joel W Fosselman
(74) Attorney, Agent, or Firm — Treyz Law Group, P.C.; Joseph F. Guihan

(57) ABSTRACT

A time delay integration image sensor may include a number of charge coupled devices (CCDs) that transfer charge in synchronization with the movement of an object being imaged. To increase the dynamic range of the image sensor, the image sensor may include circuitry configured to non-destructively sample the charge as it is transferred through the charge coupled devices. Floating gates may be included in the image sensor and may have a voltage that is proportional to the charge accumulated under the floating gates. Each floating gate may be coupled to a respective readout circuit in an additional substrate by a metal interconnect layer.

20 Claims, 12 Drawing Sheets

TIME DELAY INTEGRATION IMAGE SENSORS WITH NON-DESTRUCTIVE READOUT CAPABILITIES

BACKGROUND

This relates generally to image sensors and, more particularly, to time delay integration image sensors.

Image sensors are commonly used in electronic devices such as cellular telephones, cameras, and computers to capture images. Image sensors include photosensitive areas that generate charge in response to incident light. Time delay integration (TDI) image sensors may be used to capture images of moving objects. In a TDI image sensor, charge may be transferred across the image sensor in sync with the motion of the imaged moving object.

In conventional TDI image sensors, the dynamic range of the image sensor is limited by the charge capacity of the charge transfer channel.

It would therefore be desirable to provide improved TDI image sensors.

DETAILED DESCRIPTION

Figure 1:
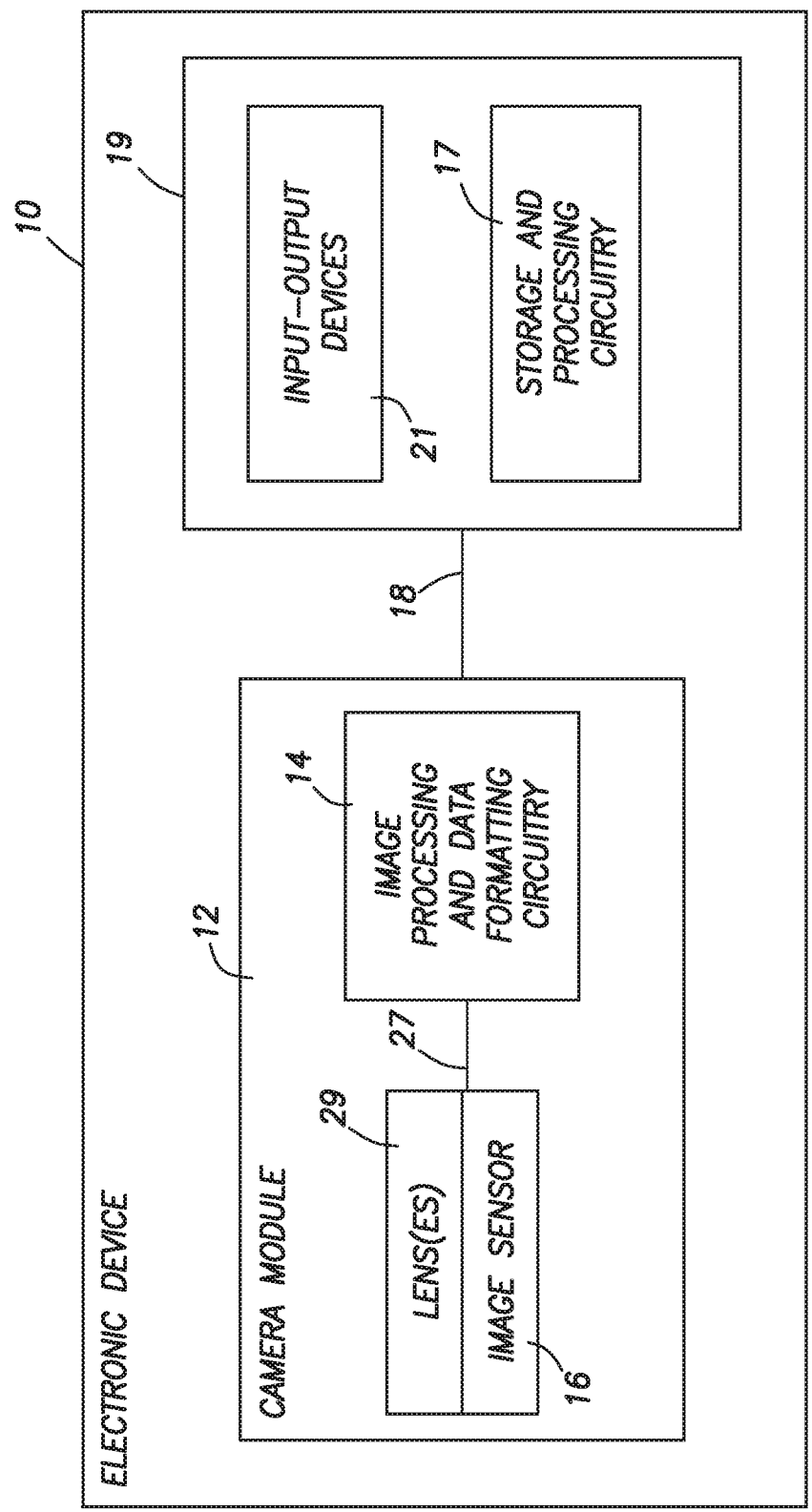
FIG. 1 is a schematic diagram of an illustrative electronic device that may include an image sensor in accordance with an embodiment.

Embodiments of the present invention relate to time delay integration (TDI) image sensors with non-destructive readout capabilities. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16 (e.g., a time delay integration image sensor). Image sensor 16 includes photosensitive elements (e.g., pixels) that convert the light into digital data. Image sensors may have any number of pixels (e.g., hundreds, thousands, millions, or more). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked.

Camera module 12 may convey acquired image data to host subsystems 19 over path 18 (e.g., image processing and data formatting circuitry 14 may convey image data to subsystems 19). Electronic device 10 typically provides a user with numerous high-level functions. In a computer or advanced cellular telephone, for example, a user may be provided with the ability to run user applications. To implement these functions, host subsystem 19 of electronic device 10 may include storage and processing circuitry 17 and input-output devices 21 such as keypads, input-output ports, joysticks, and displays. Storage and processing circuitry 17 may include volatile and nonvolatile memory (e.g., random-access memory, flash memory, hard drives, solid state drives, etc.). Storage and processing circuitry 17 may also include microprocessors, microcontrollers, digital signal processors, application specific integrated circuits, or other processing circuits.

Figure 2:
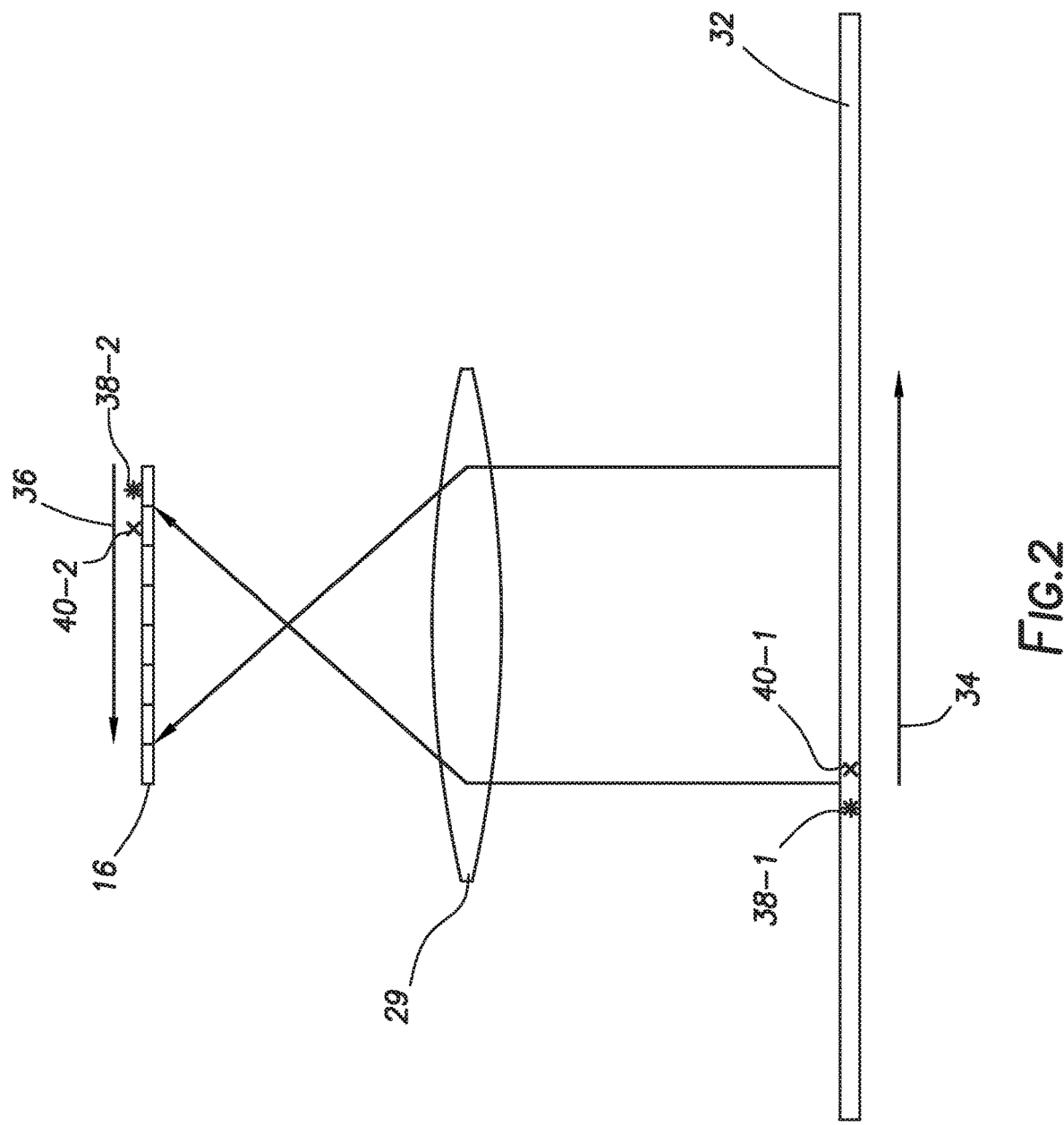
FIG. 2 is a schematic diagram showing operation of an illustrative time delay integration image sensor in accordance with an embodiment.

Image sensor 16 in FIG. 1 may be a time delay integration (TDI) image senor. TDI image sensor functionality is shown in FIG. 2. As shown in FIG. 2, TDI image sensor 16 may capture an image of scene 32 through lens 29. In the captured scene 32, an object may move in direction 34. In synchronization with the moving object, charge within TDI sensor 16 may be transferred in direction 36. In other words, the charge generated by the TDI sensor is transferred across the image sensor (e.g., from pixel-to-pixel) at the same speed as the moving object moves across the field-of-view of the image sensor. For example, when the moving object is at position 38-1, the moving object may be captured by corresponding portion 38-2 of the image sensor. Then, the moving object will move in direction 34 to location 40-1. When the moving object is at location 40-1, the moving object may be captured by corresponding portion 40-2 of the image sensor. In synchronization with the movement of the object in direction 34, the charge generated by image sensor 16 (e.g., in response to imaging the moving object) will be transferred in direction 36 (e.g., from portion 38-2 to portion 40-2). In this way, the moving object is continuously imaged as it moves across the image sensor.

Charge may be transferred within the TDI image sensor using one or more charge coupled devices (CCDs). CCDs may include a photosensitive area that generates charge in response to incident light and gates that can be asserted in a sequence to shift the charge across the CCD. Horizontal CCDs (to shift charge within a row in the image sensor) or vertical CCDs (to shift charge within a column in the image sensor) may both be used in a TDI image sensor.

In this application, an illustrative example will be discussed where charge is transferred within a given column of the TDI image sensor (e.g., charge transfer direction 36 is parallel to a column of photosensitive regions in the TDI image sensor). In other words, a vertical CCD is used for charge transfer. In this example, the number of rows in the TDI image sensor is therefore proportional to the signal integration time of the charge transfer channel. It should be understood, however, that this example is merely illustrative. The vertical CCD is aligned with the direction of the image scan. To increase dynamic range, TDI image sensors (such as image sensor 16 in FIG. 2) may have non-destructive readout capabilities. In addition to sampling the generated charge after the charge has been transferred across the entire image sensor, circuitry may be provided to enable non-destructive charge sampling intermittently as the charge is transferred across the image sensor. By using non-destructive charge sampling, the image may be observed over time as it transfers through the CCD. With destructive sampling, once a sample of an integration time is taken, the integration time can no longer be sampled again to obtain meaningful data. Using non-destructive sampling, the amount of light may be repeatedly sampled (e.g., sampled multiple times as the charge is transferred across a column). This allows for the time at which a given pixel becomes saturated to become determined and for dynamic range to be increased.

For example, consider a column in a TDI image sensor. The column may receive enough light to saturate at some point as the charge is being transferred across the charge transfer channel. With destructive sampling, the charge would be sampled after passing through the entire column. In other words, it would be impossible to determine when the saturation occurred. Using non-destructive sampling, however, the charge may be checked during transfer across the column. Therefore, the point at which saturation occurs may be determined. This increases the dynamic range of the TDI image sensor.

Figure 3:
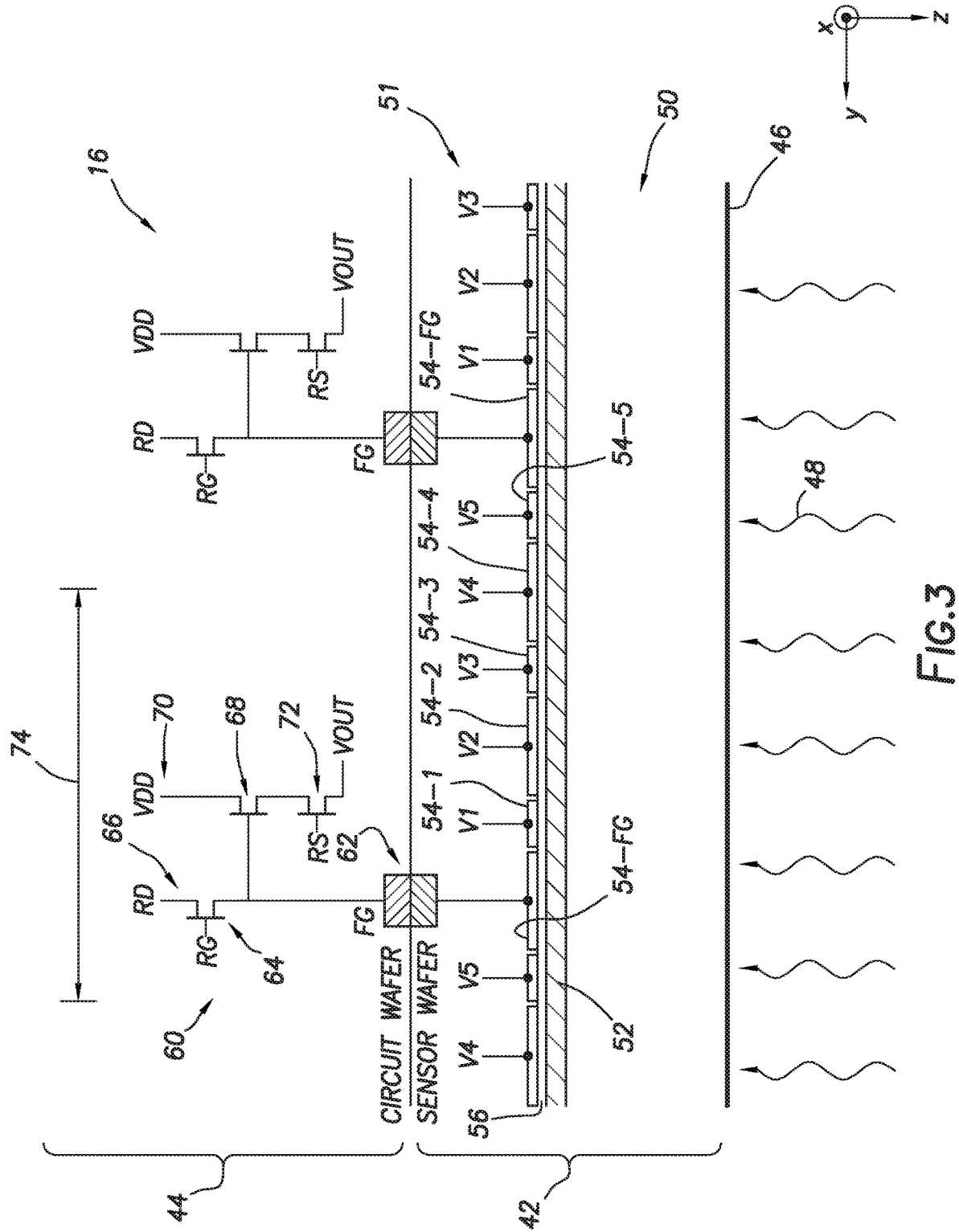
FIG. 3 is a cross-sectional side view of an illustrative time delay integration image sensor having charge coupled devices with floating gates that are coupled to readout circuits in accordance with an embodiment.

FIG. 3 is a cross-sectional side view of an illustrative TDI image sensor with non-destructive sampling capabilities. As shown, image sensor 16 includes first and second substrates 42 and 44. The substrates may be semiconductor substrates formed from a semiconductor material such as silicon. The substrates may sometimes be referred to as wafers. Substrate 42 may include photosensitive areas that generate charge in response to incident light and therefore may sometimes be referred to as a sensor wafer. Substrate 44 may include readout circuitry for non-destructively sampling charge and therefore may sometimes be referred to as a circuit wafer. The circuitry in circuit wafer 44 may be formed using complementary metal-oxide-semiconductor (CMOS) techniques. Wafer 44 may therefore sometimes be referred to as a CMOS circuit wafer. Substrate 42 may include at least one charge coupled device (CCD) and may therefore sometimes be referred to as a CCD wafer.

Substrate 42 has a backside 46 (sometimes referred to as back surface 46) that receives incident light 48. The substrate may have a photosensitive area 50 that generates charge in response to the incident light. The potential gradient of the substrate leads the electrons (generated in response to incident light) to be swept towards an n-type buried channel 52. The electrons may collect in an area of the substrate adjacent to gates 54. A gate oxide 56 may be interposed between gates 54 and the front surface of substrate 42.

Gates 54 include floating gates 54-FG and five respective gates 54-1, 54-2, 54-3, 54-4, and 54-5 between each adjacent pair of floating gates. This example is merely illustrative. In general, gates 54 may include any desired number of floating gates and any desired number of gates between adjacent floating gates. The gates 54 and photosensitive area 50 may form a charge coupled device (CCD) 51.

Floating gate 54-FG and the front surface of the substrate form a capacitor (e.g., with the floating gate acting as one capacitor electrode and the substrate acting as the other capacitor electrode). When charge accumulates in the substrate adjacent to the floating gate, the voltage on the floating gate will change. The voltage of the floating gate is therefore indicative of how much light has been received by the photosensitive areas of the image sensor. Sampling the floating gate voltage does not change the amount of charge in the substrate or the voltage of the floating gate. Therefore, the amount of charge accumulated in the substrate may be non-destructively sampled by multiple floating gates as charge is shifted through the CCD.

Intervening gates 54-1, 54-2, 54-3, 54-4, and 54-5 may each be coupled to a respective bias voltage. As shown, gate 54-1 is coupled to bias voltage V1, gate 54-2 is coupled to bias voltage V2, gate 54-3 is coupled to bias voltage V3, gate 54-4 is coupled to bias voltage V4, and gate 54-5 is coupled to bias voltage V5. Bias voltages V1, V2, V3, V4, and V5 may be manipulated to shift charge through CCD 51 (e.g., from under a first floating gate 54-FG to under gate 54-4, then from under gate 54-4 to under gate 54-2, then from under gate 54-2 to a second floating gate 54-FG).

When charge is accumulated under a respective floating gate 54-FG, the charge may optionally be sampled using readout circuit 60. Each floating gate may be coupled to a metal interconnect layer that is coupled between the first and second substrates. The metal interconnect layer may be coupled to a reset transistor 64. The reset transistor may be coupled between the metal interconnect layer and a bias voltage supply terminal 66. When reset transistor 64 is asserted, the floating gate 54-FG may be reset to a bias voltage. Metal interconnect layer 62 is also coupled to source follower transistor 68. Source follower transistor 68 is coupled between a bias voltage supply terminal 70 and a select transistor 72 (e.g., sometimes referred to as a row select transistor). When row select transistor 72 is asserted, a voltage VOUT that corresponds to the voltage of floating gate 54-FG may be output (e.g., to a corresponding column output line). Additional readout circuitry (e.g., analog-to-digital converter circuitry, sample-and-hold circuitry, etc.) may be coupled to the column output line and receive VOUT. To increase scanning speeds, column parallel analog-to-digital converters may be used. Each pixel 74 may include a corresponding floating gate 54-FG and readout circuit 60.

Figure 4:
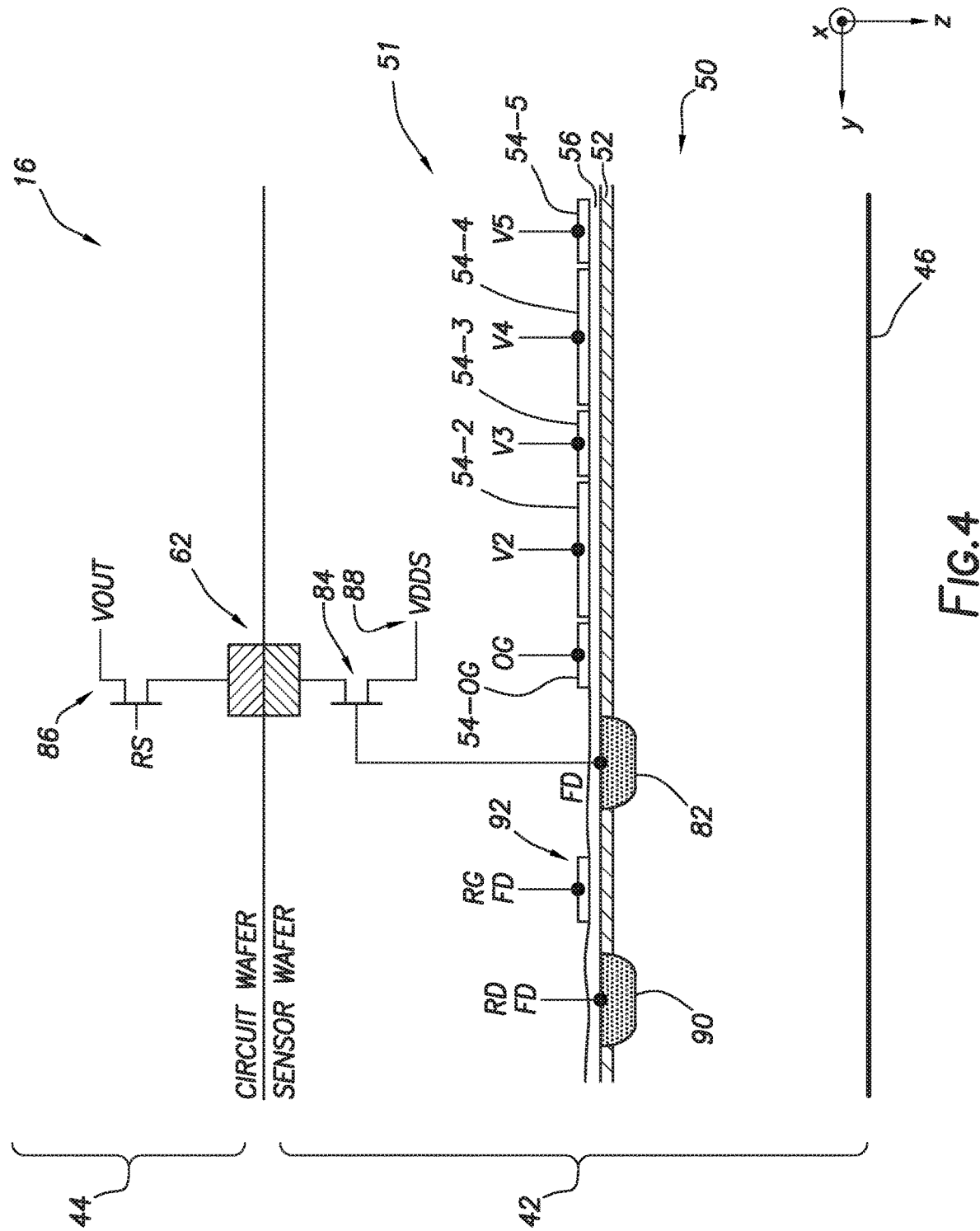
FIG. 4 is a cross-sectional side view of an illustrative time delay integration image sensor showing a floating diffusion region coupled to a readout circuit in accordance with an embodiment.

FIG. 4 is a cross-sectional side view of the output of a CCD in an illustrative image sensor. The output of the CCD may be formed at the periphery of the semiconductor substrate. Similar to as discussed in connection with FIG. 3, CCD 51 includes gates formed on the front side of the substrate (that includes buried channel 52) with an intervening gate oxide 56 between the gates and the front surface of the substrate. As shown in FIG. 4, CCD 51 may have an output gate 54-OG that is interposed between additional gates (e.g., gate 54-2) and a floating diffusion region 82. Output gate 54-OG may transfer charge from under gate 54-2 to the floating diffusion region 82 when asserted.

Floating diffusion region 82 may be formed from a doped portion (e.g., an n-type doped portion) of substrate 42. Floating diffusion region 82 is coupled to a source follower transistor 84. Source follower transistor 84 may be interposed between a bias voltage supply terminal 88 and a metal interconnect layer 62. Metal interconnect layer 62 may connect source follower transistor 84 in substrate 42 to row select transistor 86 in substrate 44. When row select transistor 86 is asserted, a voltage VOUT corresponding to the amount of charge in floating diffusion region 82 may be output (e.g., onto a column output line). Additional readout circuitry (e.g., analog-to-digital converter circuitry, sample-and-hold circuitry, etc.) may be coupled to the column output line and receive VOUT. To increase scanning speeds, column parallel analog-to-digital converters may be used.

Floating diffusion region 82 may also be selectively coupled to a drain voltage 90 by a reset gate 92. When reset gate 92 is asserted, floating diffusion region 82 may be cleared of accumulated charge.

Floating diffusion regions 82 may be optimized for high-gain low-noise measurements. In other words, the floating diffusion regions may have a low associated capacitance to increase gain and reduce noise during readout from the floating diffusion regions. Floating diffusion regions 82 (sometimes referred to as floating diffusion outputs 82, floating diffusion region outputs 82, output floating diffusion regions 82, outputs 82, etc.) may be positioned on either side of each CCD.

Figure 5:
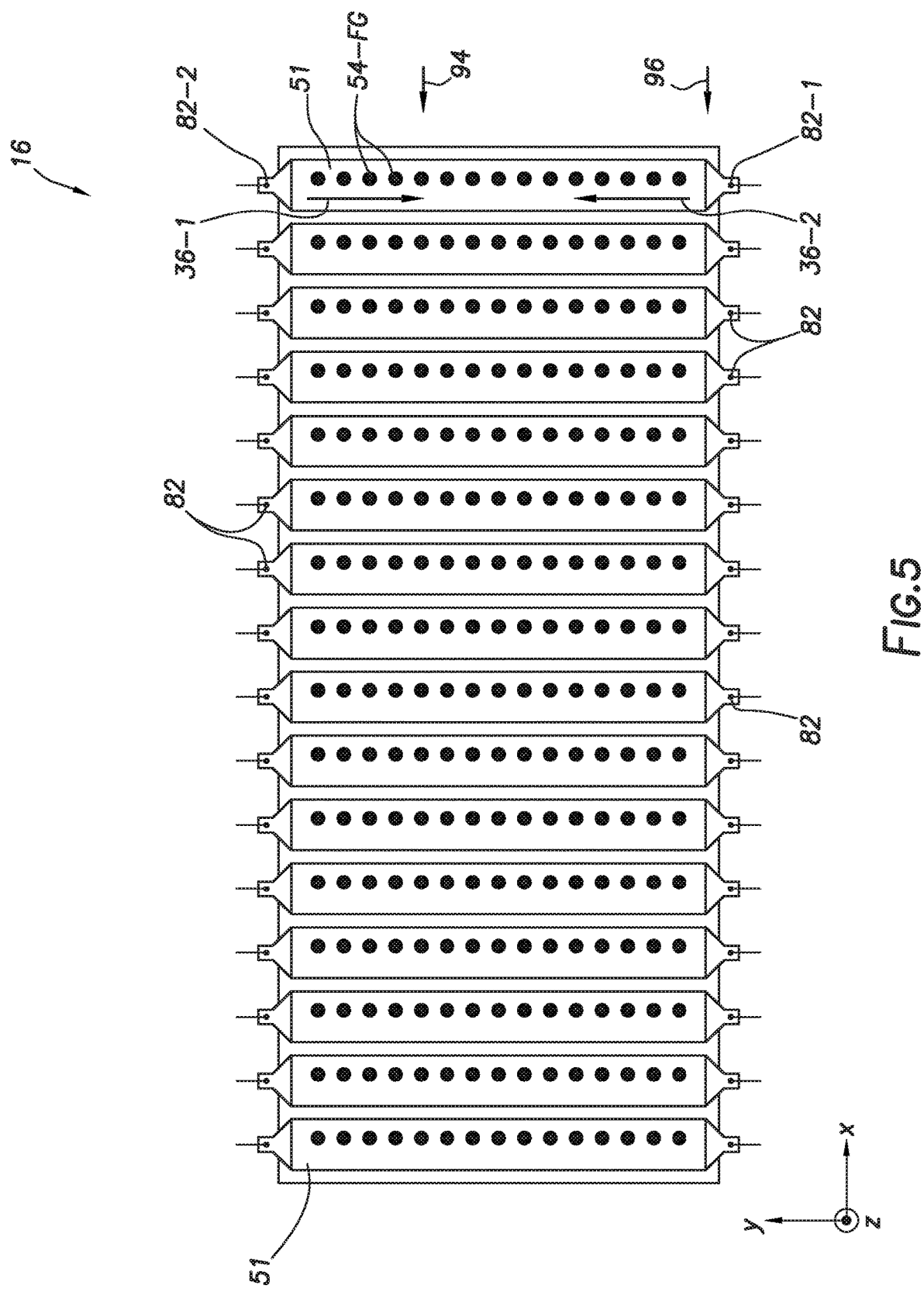
FIG. 5 is a top view of an illustrative time delay integration image sensor such as the sensor of FIGS. 3 and 4 showing how floating gates may be distributed along charge coupled devices in accordance with an embodiment.

FIG. 5 is a top view of an illustrative TDI image sensor of the type shown in FIGS. 3 and 4. As shown in FIG. 5, image sensor 16 includes a number of vertical CCDs 51. Each vertical CCD may have a corresponding output floating diffusion region 82 on either side of the vertical CCD. This enables charge transfer in both directions within the vertical CCD. For example, charge may be transferred in direction 36-1 through the vertical CCD and read from floating diffusion output 82-1. Alternatively, charge may be transferred in direction 36-2 through the vertical CCD and read from floating diffusion region 82-2.

The dots within each vertical CCD correspond to exemplary locations for floating gates 54-FG. As shown, each vertical CCD may include a number of floating gates 54-FG distributed along the vertical CCD. The cross-sectional side view of FIG. 3 may be looking in direction 94 at two floating gates 54-FG. The cross-sectional side view of FIG. 4 may be looking in direction 96 at an output floating diffusion region. Because floating gates 54-FG enable non-destructive sampling, the charge levels within the vertical CCD may be sampled at each floating gate 54-FG when the charge is transferred under that floating gate.

Figure 7:
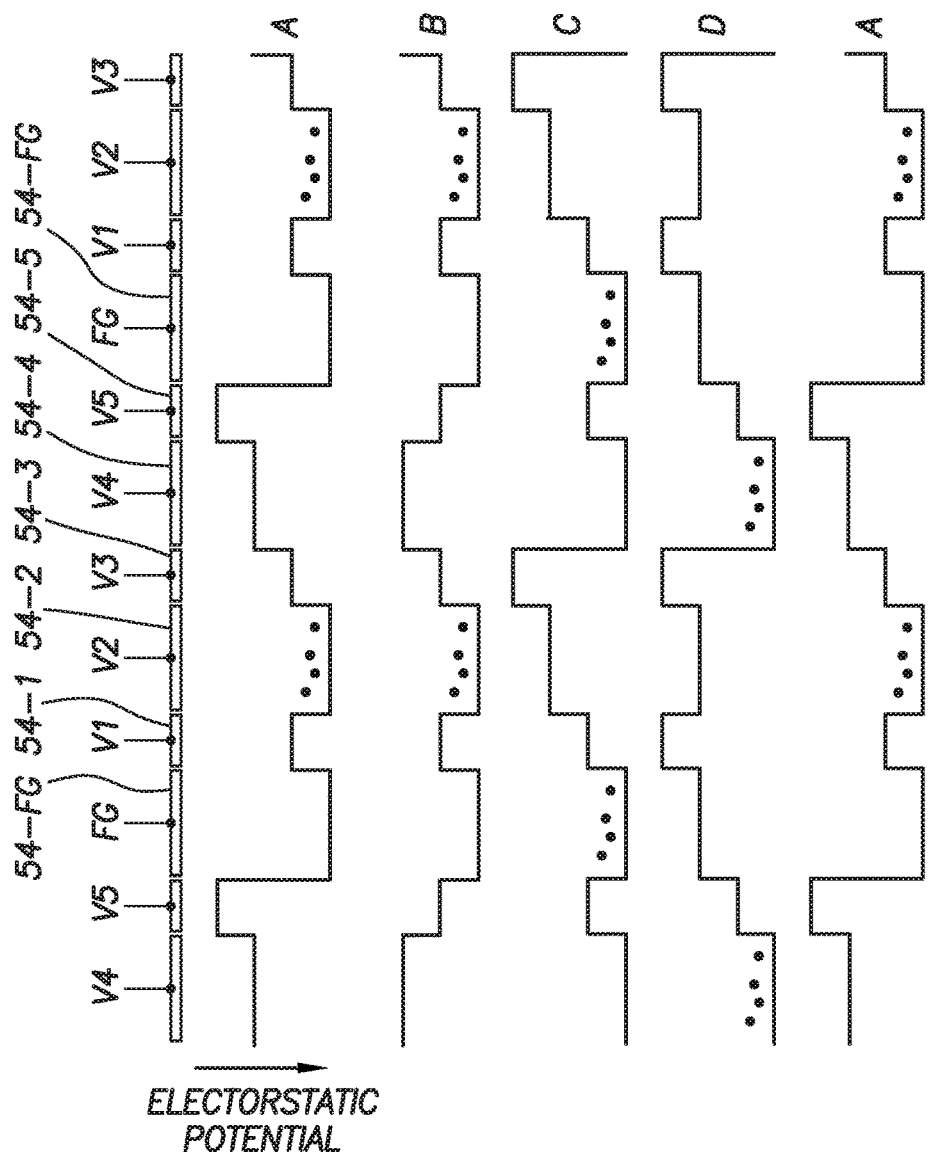
FIG. 7 is a potential diagram showing the potential of the substrate of an illustrative time delay integration image sensor at different times during operation in accordance with an embodiment.
Figure 6:
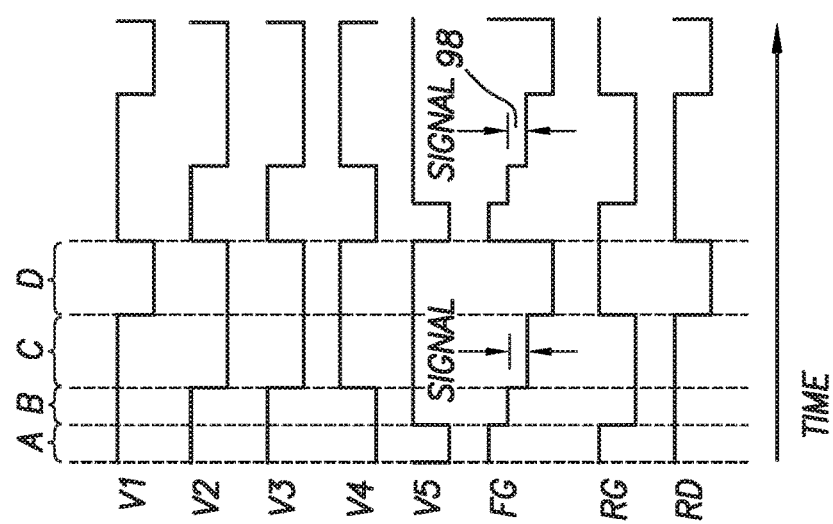
FIG. 6 is a timing diagram showing operation of an illustrative time delay integration image sensor such as the sensor of FIGS. 3-5 in accordance with an embodiment.

FIG. 6 shows an illustrative timing diagram for operation of a TDI image sensor of the type shown in FIGS. 2-5. FIG. 7 is a potential diagram that shows the potential under each gate at different times during operation of the image sensor. As shown in FIG. 6, during time period A, bias voltages V1, V2, and V3 (e.g., coupled to respective gates 54-1, 54-2, and 54-3) are raised high while bias voltages V4 and V5 (e.g., coupled to respective gates 54-4 and 54-5) are low. This results in charge accumulating under gates 54-2 (due to the electrostatic potential funneling charge under gates 54-2) as shown in FIG. 7.

Also during time period A, reset gate signal RG is high and reset voltage RD provided to bias voltage supply terminal 66 is high. This results in the reset transistor coupled to floating gate 54-FG (e.g., transistor 64 in FIG. 3) being asserted.

Next, during time period B, bias voltages V1, V2, and V3 remain high, and bias voltage V4 remains low. However, bias voltage V5 is raised. This lowers the electrostatic potential under gates 54-5 as shown in FIG. 7. Also in time period B, reset gate signal RG is lowered, resulting in reset transistor 64 being deasserted. The deassertion of reset transistor 64 may cause a small change in the voltage at floating gate 54-FG due to capacitive coupling (as shown in FIG. 6). The reset voltage level of floating gate 54-FG may be sampled during time period B.

During time period C (after reset voltage sampling is complete), bias voltages V1 and V5 may remain high. However, as shown in FIG. 6, bias voltages V2 and V3 may be lowered and bias voltage V4 may be raised. Consequently, the charge previously accumulated under gates 54-2 is funneled under floating gates 54-FG. While the charge is accumulated under floating gates 54-FG, the voltage of the floating gates 54-FG may be sampled. The difference (labeled 98 in FIG. 6) between the floating gate voltage in time period B and time period C reflects the amount of charge present under the floating gate (with the reset signal accounted for by correlated double sampling).

Finally, during time period D, bias voltages V2 and V3 may remain low and bias voltages V4 and V5 may remain high. However, bias voltage V1 may be lowered, reset gate signal RG may be raised, and reset voltage RD provided to bias voltage supply terminal 66 is lowered. This may force charge that was accumulated under floating gates 54-FG at time period C to accumulate under gates 54-4 (as shown in FIG. 7).

After time period D, the cycle may restart (returning to the same signal levels as in time period A and repeatedly proceeding through time periods A, B, C, and D). Charge transfer across the CCD may be maintained at a constant rate (e.g., cycling through time periods A, B, C, and D with a consistent timing scheme) to maintain good modulation transfer function.

Figure 8:
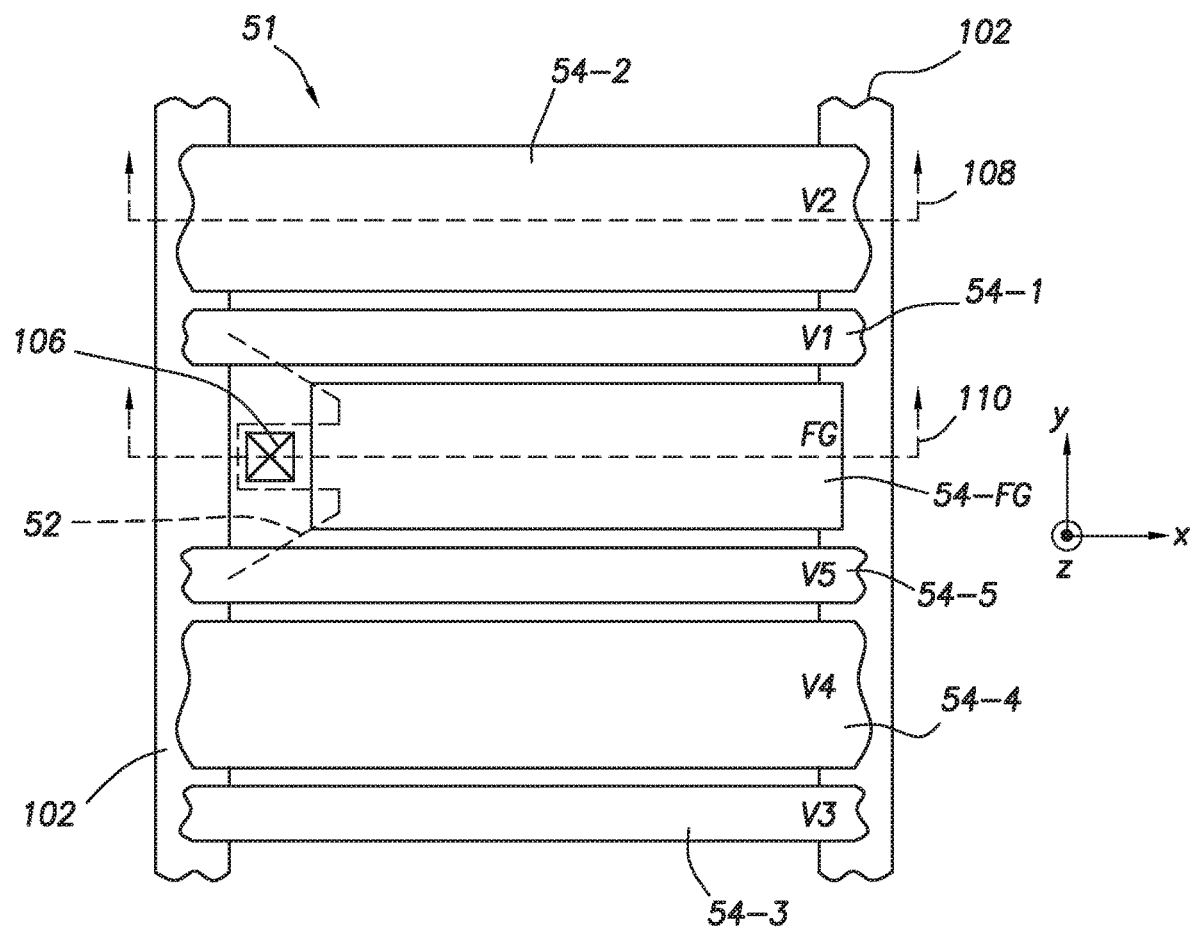
FIG. 8 is a top view of an illustrative vertical charge coupled device in a time delay integration image sensor such as the sensor of FIGS. 3-5 in accordance with an embodiment.

FIG. 8 is a top view of an illustrative vertical CCD of the type that may be incorporated into a TDI image sensor. As shown in FIG. 8, an n-type buried channel 52 may be formed between a p+ channel stop 102 (sometimes referred to as p-type channel stop). The p+ channel stop may extend along both sides of the vertical CCD parallel to the vertical CCD. The p+ channel stop may be formed form a p-type doped region of the substrate. The p+ channel stop may also include shallow trench isolation. Floating gate 54-FG may be isolated between the p+ channel stops 102. In contrast, gates 54-1, 54-2, 54-3, 54-4, and 54-5 may extend across the entire image sensor (past p+ channel stops 102). In this way, gates 54-1, 54-2, 54-3, 54-4, and 54-5 may be used for multiple vertical CCDs. For example, a single gate 54-1 may extend across multiple vertical CCDs (e.g., 10, less than 10, more than 10, more than 100, more than 1000, more than 2000, more than 4000, etc.). A single bias voltage control may be applied to the gate. In other words, the gate 54-1 may be shared between multiple vertical CCDs and controlled by a single bias voltage.

The floating gate may be adjacent to an overflow drain 106. The overflow drain may ensure that any charge that overflows (when meant to be contained in the area under floating gate 54-FG) will be drained instead of leaking into adjacent vertical CCDs or flowing backwards through the vertical CCDs. Alternatively, the overflow drain may be located in any of the other rows with gates 54-1, 54-2, 54-3, 54-4, and 54-5.

Figure 9:
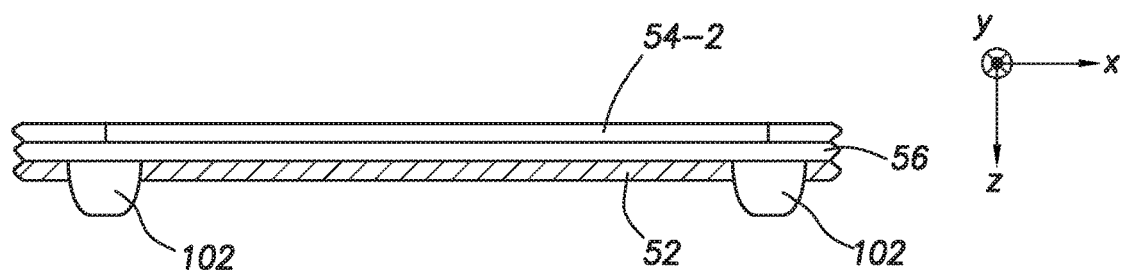
FIG. 9 is a cross-sectional side view of an illustrative gate that extends across a time delay integration image sensor such as a gate in FIG. 8 in accordance with an embodiment.

FIG. 9 is a cross-sectional side view of the vertical CCD of FIG. 8 taken along line 108 of FIG. 8. As shown in FIG. 9, gate 54-2 is formed over n-type buried channel 52 with an intervening gate oxide layer 56. P+ channel stops 102 are formed in the substrate (e.g., substrate 42). Gate 54-2 extends past the p+ channel stops 102 across the image sensor, as shown in FIG. 9.

Figure 10:
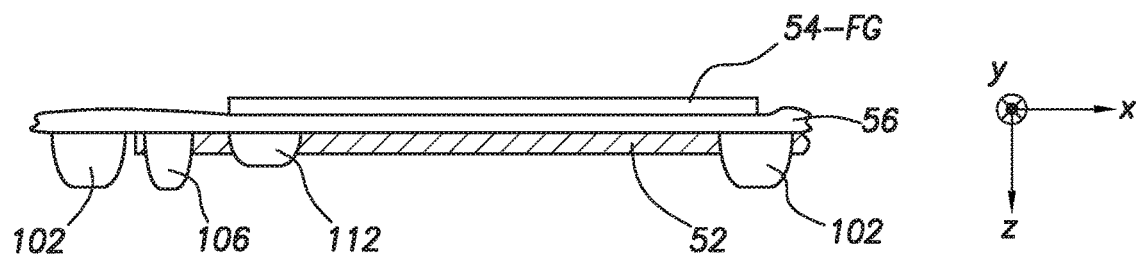
FIG. 10 is a cross-sectional side view of an illustrative floating gate such as the floating gate in FIG. 8 in accordance with an embodiment.
Figure 11:
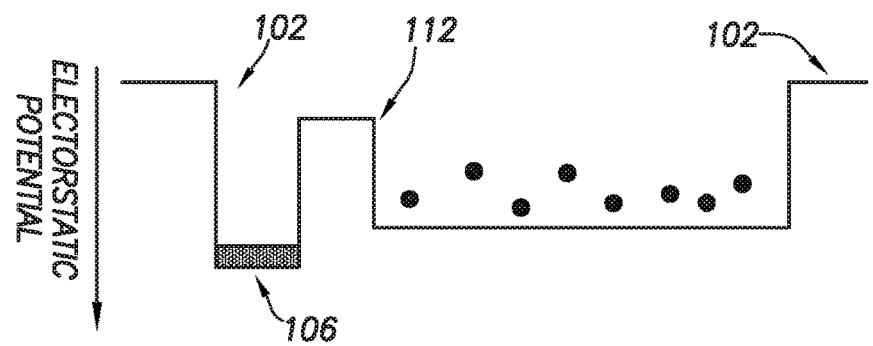
FIG. 11 is a potential diagram showing how a drain may be formed adjacent to a floating gate to prevent light leakage in accordance with an embodiment.

FIG. 10 is a cross-sectional side view of the vertical CCD of FIG. 8 taken along line 110 of FIG. 8. As shown in FIG. 10, floating gate 54-FG is formed over n-type buried channel 52 with an intervening gate oxide layer 56. P+ channel stops 102 are formed in the substrate (e.g., substrate 42). The floating gate does not extend past the p+ channel stops and is contained within the vertical CCD. An overflow barrier 112 (e.g., a p-type doped region of the semiconductor) is interposed between the region of n-buried channel 52 under floating gate 54-FG and n+ drain 106. As shown in the potential diagram of FIG. 11 (that corresponds to the cross-section of FIG. 10), the overflow barrier has a potential that is lower than the potential of area under the floating gate (to ensure charge stays accumulated under the floating gate). However, the overflow barrier has a potential that is higher than the potential of the p+ channel stops (to ensure that charge will overflow into drain 106 instead of over p+ channel stops 102).

Figure 12:
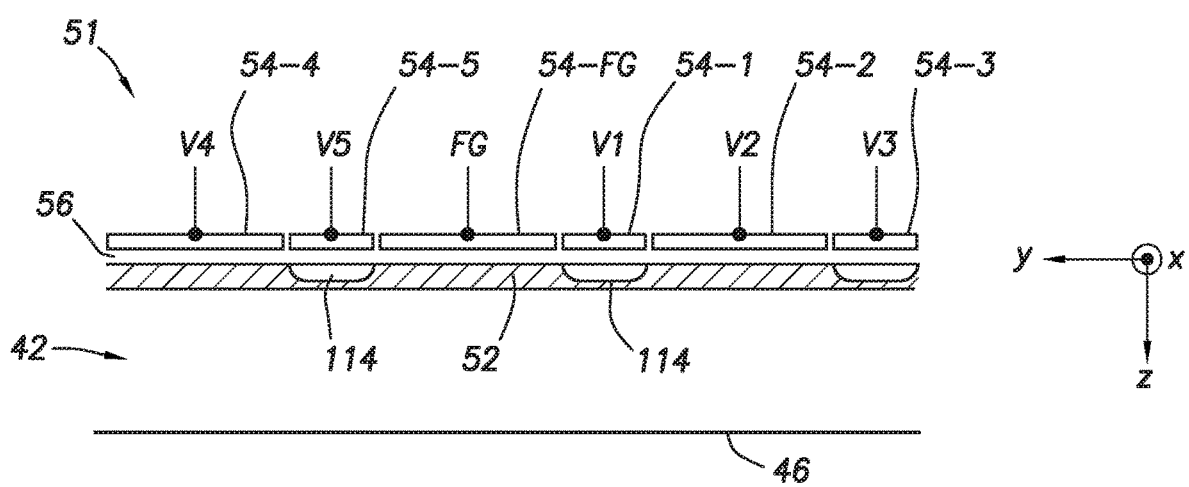
FIG. 12 is a cross-sectional side view of an illustrative charge coupled device for a time delay integration sensor showing how p-barrier implants may be included under some of the gates in the charge coupled device in accordance with an embodiment.

FIG. 12 is a cross-sectional side view of the vertical CCD showing how p-type barrier implants maybe used to adjust the channel potential. As shown in FIG. 12, p-type barrier implants 114 (e.g., sometimes referred to as p-type doped region 114) may be formed in the n-buried channel underneath gates such as gates 54-1, 54-3, and 54-5. The p-type barrier implants may adjust the potential so that all gates may use 0 to +3.3V timing during operation of the image sensor. This example is merely illustrative. The p-type barrier implants may optionally be omitted and any desired voltages may be applied to the gates during operation of the image sensor. Alternatively, the barrier may be formed by an extra n-type implant underneath gates 54-2, 54-4, and 54-FG.

Figure 13:
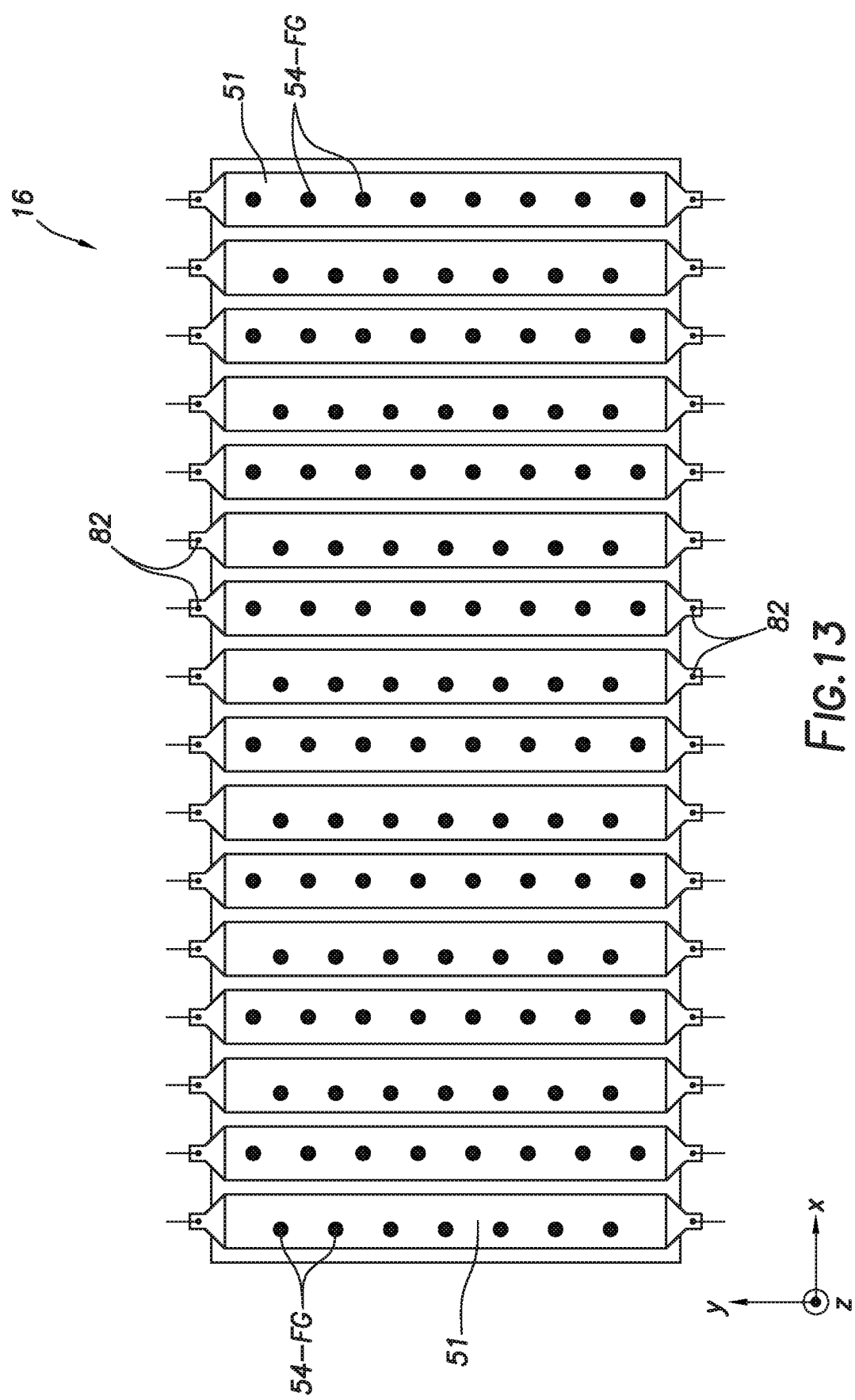
FIG. 13 is a top view of an illustrative time delay integration image sensor having a reduced density of floating gates in each charge coupled device in accordance with an embodiment.

The example of locations for floating gates in FIG. 5 is merely illustrative. In FIG. 5, every pixel may have a floating gate with a respective readout circuit that is configured to non-destructively sample charge. However, this example is merely illustrative. If desired, only some pixels may include a floating gate with a respective readout circuit that is configured to non-destructively sample charge. Other pixels may instead include a gate that receives a bias voltage (similar to gates 54-1, 54-2, 54-3, 54-4 and 54-5). Every other row of pixels may include a floating gate that is coupled to a metal interconnect layer and respective readout circuit. Every other row of pixels may include a gate that receives a bias voltage. In general, a floating gate with a respective readout circuit that is configured to non-destructively sample charge may be included any desired number of rows (e.g., every other row, every three rows, every four rows, etc.). FIG. 13 is a top view of an illustrative image sensor with vertical CCDs that include a reduced density of floating gates compared to FIG. 5. In other words, in FIG. 13 every row need not include a floating gate.

Figure 14:
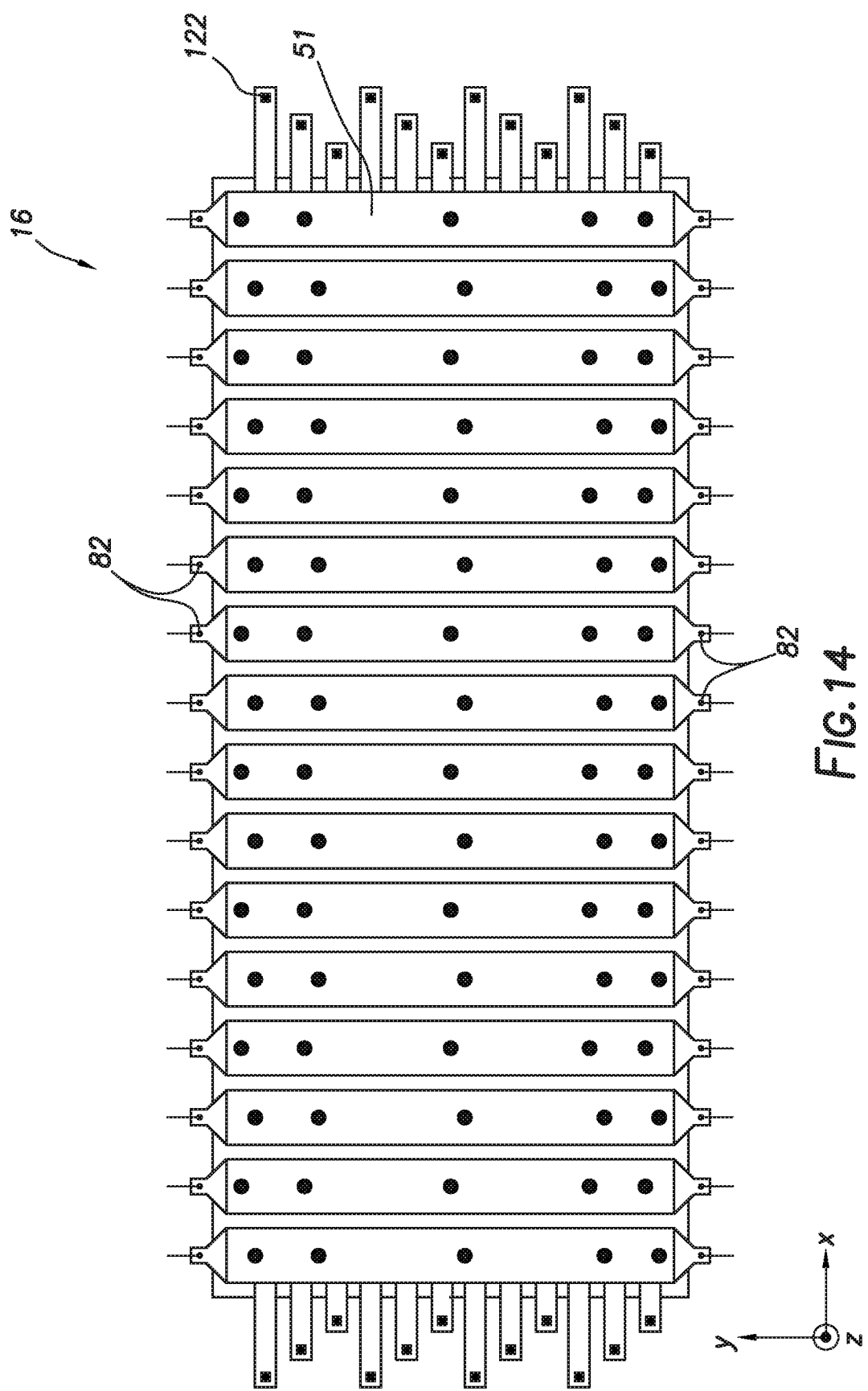
FIG. 14 is a top view of an illustrative time delay integration image sensor having a non-uniform density of floating gates in each charge coupled device in accordance with an embodiment.

The floating gates do not need to have a uniform density across the array. In some cases, as shown in FIG. 14, the floating gates may have a non-uniform (varying) density across the array. In one illustrative example, it may be desirable to sample rows 1, 4, 16, and 64 of each vertical CCD. Floating gates may be provided at these locations in either direction of the vertical CCD (for the option of charge transfer in either direction). In general, each vertical CCD may have any desired arrangement of floating gates with readout circuits (arranged uniformly at any desired intervals or non-uniformly with any desired interval between each adjacent pair of floating gates).

FIG. 14 also shows how contacts 122 providing bias voltages (e.g., bias voltages V1, V2, V3, V4, and V5) may be provided to the gates at the periphery of image sensor. Contacts 122 may be coupled to metal interconnect layers (e.g., metal interconnect layers 62) that couple the gates (54-1, 54-2, 54-3, 54-4, and 54-5) in substrate 42 to bias voltage supply terminals in substrate 44.

Figure 15:
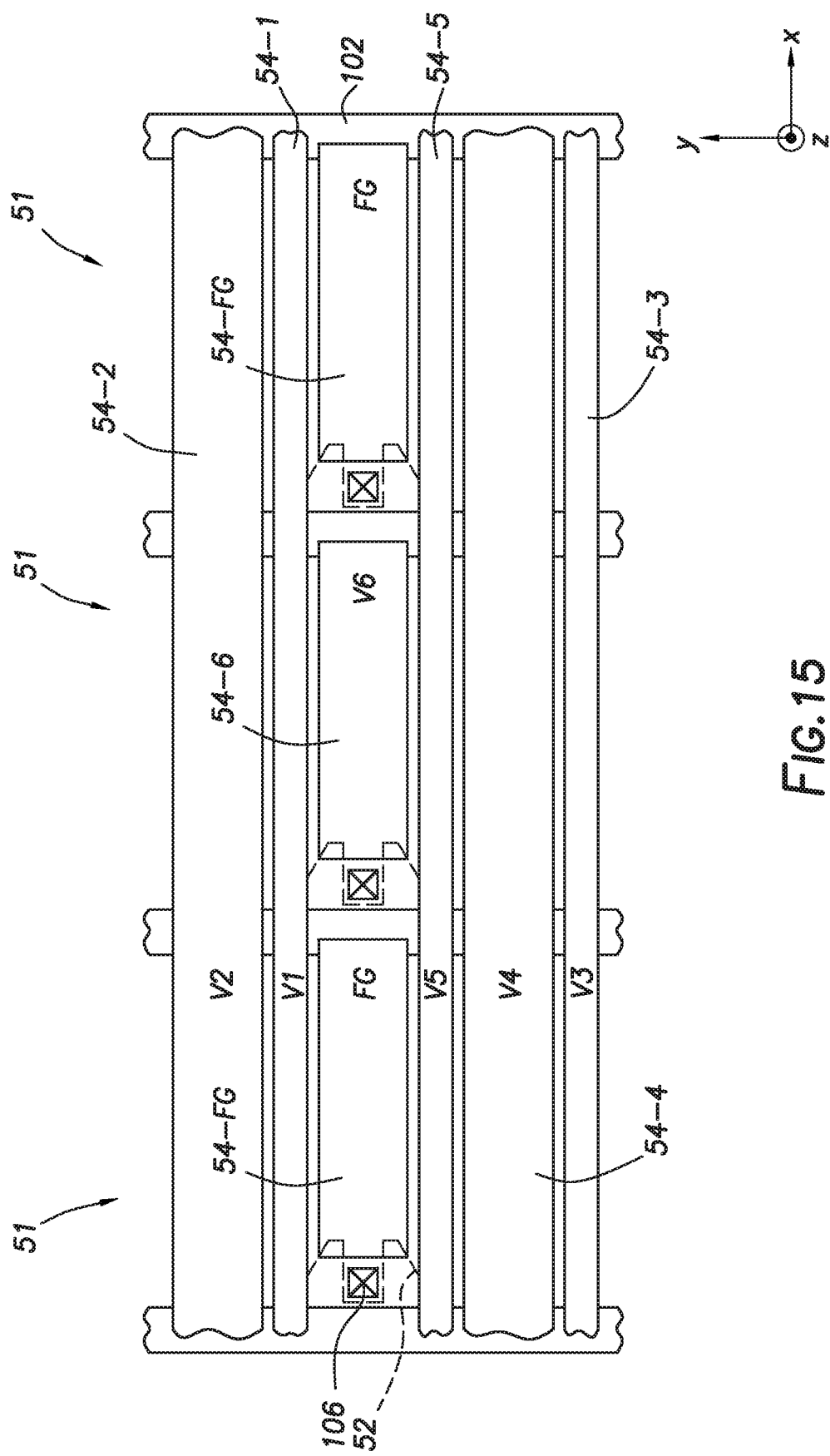
FIG. 15 is a top view of illustrative charge coupled devices for a time delay integration image sensor showing how a bias voltage may be applied to a floating gate instead of using the floating gate for charge sampling in accordance with an embodiment.

FIG. 15 is a top view of illustrative vertical CCDs of an image sensor showing how an additional gate may replace a floating gate in the CCD. As shown in FIG. 15, each vertical CCD 51 is interposed between respective p+ channel stops 102. Gates 54-1, 54-2, 54-3, 54-4, and 54-5 and extend across the image sensor between the vertical CCDs. The left-most and right-most vertical CCDs in FIG. 15 include floating gates 54-FG interposed between gates 54-1 and 54-5. The middle vertical CCD in FIG. 15 does not include a floating gate 54-FG. Instead, the middle vertical CCD includes a gate 54-6 that is coupled to an additional bias voltage V6. Gate 54-6 may have the same layout as the floating gates 54-FG in adjacent vertical CCDs.

Figure 17:
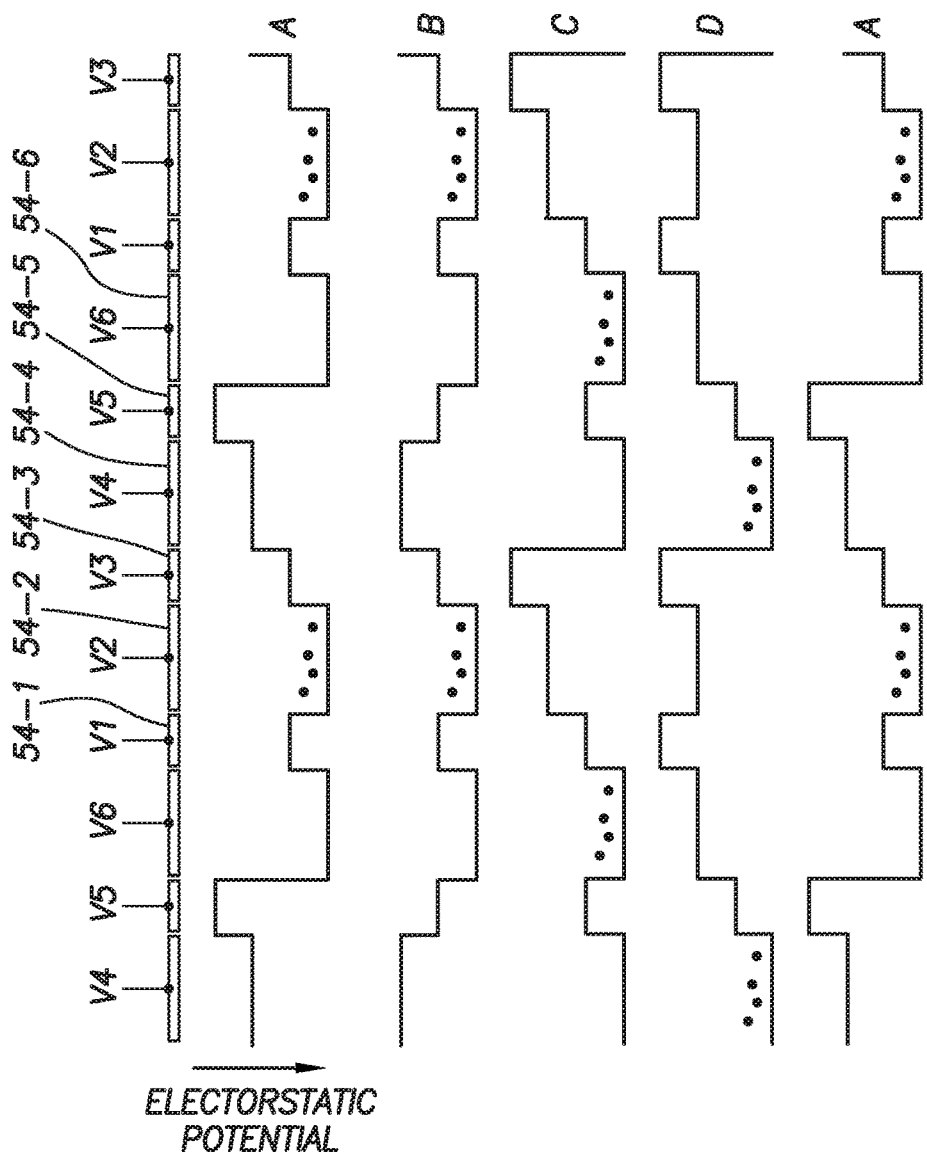
FIG. 17 is a potential diagram showing the potential of the substrate of an illustrative time delay integration image sensor at different times of FIG. 16 in accordance with an embodiment.
Figure 16:
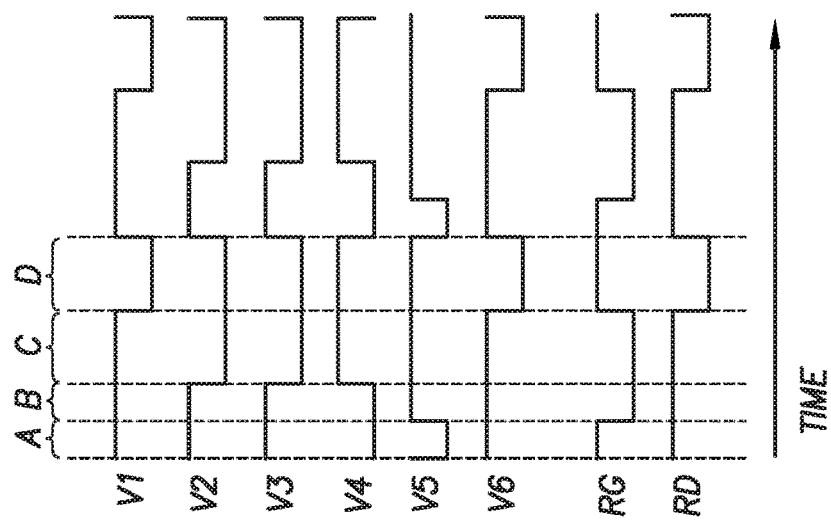
FIG. 16 is a timing diagram showing operation of an illustrative time delay integration image sensor with a floating gate that is not used for charge sampling in accordance with an embodiment.

FIG. 16 shows an illustrative timing diagram for operation of a TDI image sensor of the type shown in FIG. 15 (with a gate 54-6 that is not read out in place of a floating gate that is sampled). FIG. 17 is a potential diagram that shows the potential under each gate at different times during operation of the image sensor. As shown in FIG. 16, during time period A, bias voltages V1, V2, and V3 (e.g., coupled to respective gates 54-1, 54-2, and 54-3) are raised high while bias voltages V4 and V5 (e.g., coupled to respective gates 54-4 and 54-5) are low. This results in charge accumulating under gates 54-2 (due to the electrostatic potential funneling charge under gates 54-2) as shown in FIG. 17.

In some cases, gate 54-6 may be coupled to a respective readout circuit similar to the floating gates 54-FG shown in FIG. 3. In other words, gate 54-6 may serve as either a floating gate that is used to non-destructively sample charge or may serve as a gate that only shifts charge through the CCD. Although labeled as gate 54-6 instead of 54-FG to delineate between situations when the gate is sampled and situations when the gate is not sampled, it should be understood that the structure of the gate may be the same as the floating gates discussed previously (e.g., a single floating gate may be coupled to a readout circuit and a bias voltage V6). If gate 54-6 has optional non-destructive charge sampling capabilities, the settings of the image sensor may determine whether or not the gate is used for charge sampling. If gate 54-6 is coupled to a readout circuit as shown in FIG. 3, reset gate signal RG may be high and reset voltage RD provided to bias voltage supply terminal 66 may be high during time period A. This results in the reset transistor coupled to gate 54-6 (e.g., transistor 64 in FIG. 3).

Next, during time period B, bias voltages V1, V2, and V3 remain high, and bias voltage V4 remains low. However, bias voltage V5 is raised. This lowers the electrostatic potential under gates 54-5 as shown in FIG. 17. Also in time period B, reset gate signal RG is lowered, resulting in reset transistor 64 being deasserted.

During time period C, bias voltages V1 and V5 may remain high. However, as shown in FIG. 6, bias voltages V2 and V3 may be lowered and bias voltage V4 may be raised. Consequently, the charge previously accumulated under gates 54-2 is funneled under gates 54-6.

Finally, during time period D, bias voltages V2 and V3 may remain low and bias voltages V4 and V5 may remain high. However, bias voltage V1 may be lowered, bias voltage V6 may be lowered, reset gate signal RG may be raised, and reset voltage RD provided to bias voltage supply terminal 66 is lowered. This may force charge that was accumulated under gates 54-6 at time period C to accumulate under gates 54-4 (as shown in FIG. 17).

After time period D, the cycle may restart (returning to the same signal levels as in time period A and repeatedly proceeding through time periods A, B, C, and D).

The foregoing is merely illustrative of the principles of this invention and various modifications can be made by those skilled in the art without departing from the scope and spirit of the invention. While the invention has been described using electrons as the signal charge those skilled in the art know the p-implant and n-implant conductivity types may be reversed and use holes as the signal charge.

What is claimed is:

1. An image sensor comprising:
   a semiconductor substrate having first and second opposing surfaces;
   a plurality of floating gates formed adjacent to the first surface of the semiconductor substrate;
   a plurality of readout circuits, wherein each floating gate of the plurality of floating gates is coupled to a respective readout circuit of the plurality of readout circuits; and
   a plurality of additional gates formed adjacent to the first surface of the semiconductor substrate, wherein a respective subset of the plurality of additional gates is interposed between each adjacent pair of floating gates.

2. The image sensor defined in claim 1, wherein a voltage of each floating gate is dependent upon an amount of charge accumulated in the semiconductor substrate adjacent to that floating gate.

3. The image sensor defined in claim 1, further comprising:
   gate oxide formed on the first surface, wherein the plurality of floating gates is formed on the gate oxide.

4. The image sensor defined in claim 1, wherein the semiconductor substrate is a first semiconductor substrate, the image sensor further comprising:
   a second semiconductor substrate, wherein the plurality of readout circuits is formed in the second semiconductor substrate.

5. The image sensor defined in claim 4, further comprising:
   a plurality of metal interconnect layers, wherein each metal interconnect layer is coupled between a respective floating gate and a respective readout circuit.

6. The image sensor defined in claim 5, wherein each readout circuit comprises:
   a source follower transistor coupled to the respective metal interconnect layer; and
   a reset transistor coupled to the respective metal interconnect layer.

7. The image sensor defined in claim 6, wherein each readout circuit further comprises:
   a bias voltage supply terminal; and
   a row select transistor, wherein the source follower transistor is coupled between the bias voltage supply terminal and the row select transistor.

8. The image sensor defined in claim 1, wherein the semiconductor substrate includes a buried channel of a first conductivity type adjacent to the first surface of the semiconductor substrate of a second conductivity type.

9. The image sensor defined in claim 8, further comprising:
   channel stops of the second conductivity type in the semiconductor substrate of the second conductivity type, wherein each gate of the plurality of additional gates extends over multiple channel stops of the second conductivity type and wherein each floating gate of the plurality of floating gates is formed between a respective adjacent pair of channel stops of the second conductivity type.

10. The image sensor defined in claim 1, further comprising:
    a floating diffusion region in the semiconductor substrate, wherein a gate of the plurality of additional gates is configured to transfer charge to the floating diffusion region.

11. The image sensor defined in claim 10, further comprising:
    a readout circuit coupled to the floating diffusion region; and
    a reset gate formed adjacent to the first surface of the semiconductor substrate, wherein the reset gate is configured to drain charge from the floating diffusion region.

12. The image sensor defined in claim 11, wherein the floating diffusion region is formed at a periphery of the semiconductor substrate.

13. The image sensor defined in claim 10, wherein the semiconductor substrate is a first semiconductor substrate, the image sensor further comprising:
a second semiconductor substrate, wherein the plurality of readout circuits is formed in the second semiconductor substrate.

14. The image sensor defined in claim 1, further comprising:
a plurality of overflow drains in the semiconductor substrate, wherein each overflow drain is adjacent to a respective gate selected from the group consisting of: one of the plurality of floating gates and one of the plurality of additional gates.

15. An image sensor comprising:
a charge coupled device configured to transfer charge from a first side of the image sensor to a second side of the image sensor, wherein the charge coupled device includes a plurality of floating gates and wherein the plurality of floating gates has a varying density; and
readout circuitry configured to sample the charge multiple times as the charge is transferred from the first side of the image sensor to the second side of the image sensor.

16. The image sensor defined in claim 15, wherein the readout circuitry comprises a plurality of readout circuits and wherein each readout circuit is coupled to a respective floating gate.

17. The image sensor defined in claim 15, wherein the charge coupled device includes a set of intervening gates between each adjacent pair of floating gates and wherein each set of intervening gates is configured to transfer charge between the adjacent pair of floating gates.

18. An image sensor comprising:
a semiconductor substrate that includes a plurality of charge coupled devices;
a plurality of gates on the semiconductor substrate that extend across the plurality of charge coupled devices; and
a plurality of floating gates on the semiconductor substrate, wherein each floating gate of the plurality of floating gates is contained within a respective charge coupled device of the plurality of charge coupled devices and wherein a voltage of each floating gate is dependent upon an amount of charge accumulated in the semiconductor substrate adjacent to that floating gate.

19. The image sensor defined in claim 18, further comprising:
a plurality of overflow drains in the semiconductor substrate, wherein each overflow drain is adjacent to a respective floating gate.

20. The image sensor defined in claim 18, wherein each charge coupled device is coupled to a respective first floating diffusion output region on a first side of the image sensor and a respective second floating diffusion output region on an opposing second side of the image sensor.

* * * * *